United States Patent
Moughabghab

(10) Patent No.: US 6,300,824 B1
(45) Date of Patent: Oct. 9, 2001

(54) ANALOG OFFSET CANCELLATION METHOD AND CIRCUIT AND AMPLIFIER USING SUCH CIRCUIT

(75) Inventor: Raëd Moughabghab, Mougins (FR)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/265,480

(22) Filed: Mar. 9, 1999

(51) Int. Cl.$^7$ ........................................... H03F 1/02
(52) U.S. Cl. ................... 330/9; 330/258; 327/307; 333/214
(58) Field of Search .................. 330/9, 258; 327/307, 327/103, 110; 333/214, 215

(56) References Cited

U.S. PATENT DOCUMENTS

| | | |
|---|---|---|
| 3,643,183 * | 2/1972 | Geffe .................................... 333/80 R |
| 4,262,543 * | 4/1981 | Grebe, Jr. et al. ................. 73/861.17 |
| 4,322,687 * | 3/1982 | Dwarakanath et al. .................. 330/9 |
| 4,441,081 * | 4/1984 | Jenkins ..................................... 330/110 |
| 4,628,274 | 12/1986 | Vittoz et al. . |
| 5,027,116 * | 6/1991 | Armstrong et al. .................. 341/120 |
| 5,663,680 * | 9/1997 | Nordeng ..................................... 330/9 |
| 5,699,006 * | 12/1997 | Zele et al. ............................. 327/341 |

OTHER PUBLICATIONS

European Solid State Circuits Conference, Article by: Jose Silva, Paulo Rodrigo, C. Azeredo Leme, J.E. Franca, A Low–Power High–Speed Self–Calibrated Differential Comparator, 1995, pp. 90–93, No Month.

* cited by examiner

Primary Examiner—Benny Lee
Assistant Examiner—Henry Choe
(74) Attorney, Agent, or Firm—Snell & Wilmer, L.L.P.

(57) ABSTRACT

An analog offset cancellation technique is based on the observation that the voltage developed across an inductor is proportional to the time derivative of the current passing through the inductor. An input voltage that may contain an undesired DC offset voltage is converted to a current that is representative of the input voltage. The resulting input current is passed through an inductor and the voltage generated across the inductor is used as the new input voltage. Because the voltage developed across the inductor is equal to the time derivative of the current passing through the inductor, the resulting voltage, the new input voltage, is independent of any DC components.

10 Claims, 2 Drawing Sheets

ANALOG OFFSET CANCELLATION METHOD AND CIRCUIT AND AMPLIFIER USING SUCH CIRCUIT

BACKGROUND OF THE INVENTION

This invention relates generally to an analog circuit and technique, and more specifically to an analog offset cancellation technique and to a circuit and amplifier using that technique.

As the semiconductor industry advances, the size of individual devices used in the fabrication of integrated circuits continues to shrink. The shrinking of device sizes has many advantages, including the ability to implement more and more complex circuit functions on a single semiconductor device. But the shrinking of device sizes also has its drawbacks. One of the most serious drawbacks encountered with submicron device sizes results from transistor mismatches as is explained below. Often a circuit design requires the matching of two or more transistors or other devices. If those devices do not match precisely, an undesired offset in some circuit parameter may result. That offset, in turn, may result in some unwanted circuit behavior, or may even cause the circuit to fail completely. Small mismatches in devices can result from differences in insulator thicknesses, differences in device or element size or spacing, variations in the crystalline structure of the semiconductor material, and the like. These small mismatches become more significant as the device size shrinks. A small mismatch may be tolerable with large devices, but a mismatch of the same magnitude may be intolerable with small devices, because the mismatch represent a greater percentage of the overall device characteristic as the total device size shrinks.

The effect of device mismatch is especially apparent on the overall behavior of analog blocks such as operational amplifiers or Gm-C filters. The effects of device mismatch can result in the generation of unwanted offset voltages. The resulting offset, in turn, is most troublesome in analog transceiver chains that contain several amplifying blocks. In such a chain a small input analog signal is detected and may undergo several stages of amplification. Amplifying the useful signal also amplifies all parasitic signals that accompany that detected useful signal. Among the parasitic signals may be an offset voltage caused by the mismatch of transistors in the chain. A small offset voltage, after several stages of amplification, can result in a significant and undesirable parasitic voltage added to and perhaps even masking the desired signal.

There are several ways to reduce offset voltage in an analog circuit, but most are sampled solutions. This means that a switching scheme is used to reduce the offset voltage by memorizing the offset voltage on a capacitor during a first time slot and thereafter subtracting it from the signal during a later time slot. Such solutions are complex, require many devices, and consume considerable power. A need therefore existed for an analog offset cancellation technique that provides a continuous way of reducing the offset and which can be easily derived from existing circuits and circuit techniques.

DETAILED DESCRIPTION OF PREFERRED EMBODIMENTS

If the voltage applied to a circuit block includes a DC offset voltage in addition to the desired AC signal voltage, the result at the output of that circuit block may be undesirable unless the DC offset voltage is cancelled or eliminated. This is especially true if the circuit block provides an amplifying function that amplifies the DC offset. The undesired DC offset voltage may be cancelled, in accordance with the invention, by a continuous time analog offset cancellation technique which is based on the observation that the voltage developed across an inductor is equal to the time derivative of the current passing through that inductor. That is, V=L dI/dt. Hence, if the current passing through the inductor is a constant, the voltage developed across the inductor is zero. Or more generally, if a current passing through an inductor includes a constant component, the voltage developed across the inductor as a result of this constant component is zero. This concept is used in the offset cancellation technique in accordance with the invention. In accordance with the invention an input voltage, $V_{in}$, that is composed of the desired input voltage signal, $V_{sig}$, and a DC offset voltage, $V_{off}$, is converted to an input current, $I_{in}$. The current $I_{in}$ is then passed through an inductor and the voltage developed across the inductor is used as the new input voltage. Because the voltage drop developed across the inductor is equal to the time derivative of the current passing through the inductor, the voltage developed across the inductor is independent of any DC components in the input current and hence in the input voltage.

Figure 1:
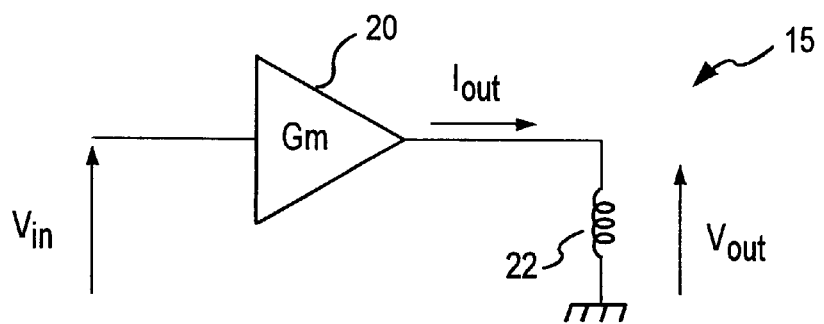
FIG. 1 schematically illustrates a technique for reducing offset contained in an input signal.

FIG. 1 illustrates schematically an offset cancellation circuit 15 in accordance with the invention utilizing an ideal inductor. An input voltage $V_{in}$ includes the desired input signal voltage and an undesired DC voltage offset. That is, $V_{in}=V_{sig}+V_{off}$. The input voltage is applied to the input of a transconductance stage 20, having a transconductance Gm. The transconductance stage transforms the input voltage to an output current where $I_{out}=Gm \times V_{in}$. The output current consists of two parts: a signal current proportional to $V_{sig}$ and an offset current proportional to $V_{off}$. That is, $I_{out}=I_{sig}+I_{off}$. When this current passes through inductor 22, a voltage, $V_{out}$ is developed across the inductor. Because $I_{off}$ is proportional to the DC offset voltage, the time derivative of $I_{off}$ is equal to zero and the output voltage $V_{out}$ is independent of the offset voltage. That is, the offset elimination circuit 15 eliminates the DC offset component of the voltage applied at the input of the circuit.

Figure 2:
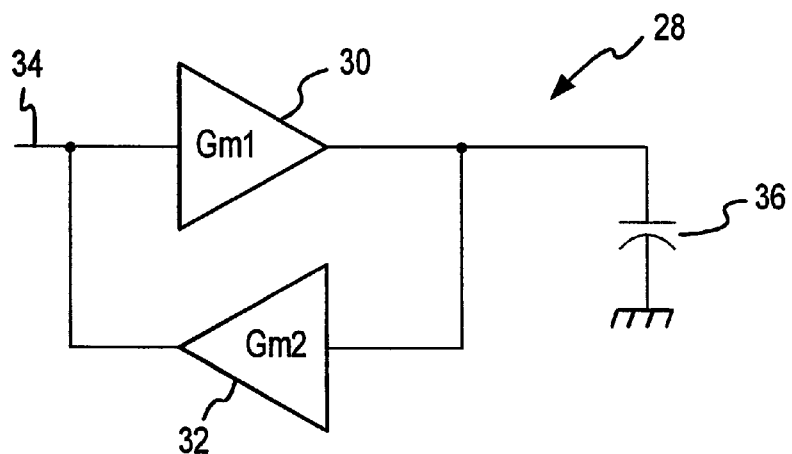
FIG. 2 schematically illustrates an inductance-equivalent circuit.

The grounded inductor 22 can be built as an inductance-equivalent circuit 28 including a combination of two transconductance stages 30 and 32 and a capacitor 36 as illustrated in FIG. 2. Transconductance stages 30 and 32, having transconductances Gm1 and Gm2, respectively, are cross coupled as illustrated. The input 34 to the inductance-equivalent circuit 28 is coupled to the input of transconductance stage 30 and to the output of transconductance stage 32. The output of transconductance stage 30 and the input of transconductance stage 32 are coupled together and are commonly coupled to capacitor 36. Capacitor 36 is coupled to a logic circuit ground. The equivalent inductance of circuit 28 is given by L=C/(Gm1×Gm2).

Figure 3:
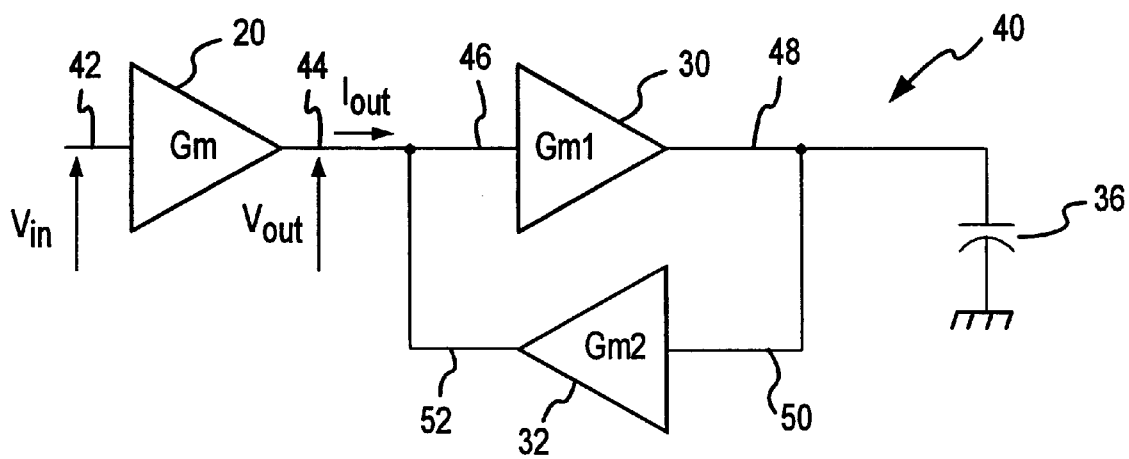
FIG. 3 illustrates schematically an offset cancellation circuit in accordance with the invention.

FIG. 3 illustrates schematically an offset cancellation circuit 40 in accordance with the invention. Elements of FIG. 3 which are common with FIGS. 1 and 2 are given like reference numerals. The voltage $V_{in}$ is applied to the input 42 of the offset cancellation circuit. Input 42 is also the input to transconductance stage 20. The input voltage, $V_{in}$, may include an undesired offset voltage $V_{off}$. Transconductance stage 20 has the effect of converting the input voltage to a current, $I_{out}$, which appears at the output 44 of transconductance stage 20. The output current, which may include a component proportional to any offset voltage included in the input voltage, is applied to the input 46 of transconductance stage 30. Transconductance stage 30, having a transconductance Gm1, is cross-coupled with transconductance stage 32 having a transconductance Gm2. The output 48 of transconductance stage 30 is coupled to the input 50 of transconductance stage 32. The output 52 of transconductance stage 32 is coupled to the input of transconductance stage 30. The output of transconductance stage 30 is also coupled to grounded capacitor 36.

The combination of transconductance stages 30 and 32 together with grounded capacitor 36 form an inductance-equivalent circuit. As the current $I_{out}$ is applied to this inductance-equivalent circuit, a voltage $V_{out}$ is developed which is proportional to the time derivative of the current $I_{out}$. The voltage $V_{out}$ is detected at node 44 at the output of transconductance stage 20. Because of the time differentiation, the output voltage $V_{out}$ is independent of any DC components included in the input voltage, $V_{in}$.

Offset cancellation circuit 40 also provides a high pass filter in the frequency domain. The cutoff frequency, $f_c$, of this high pass filter is given by $f_c=(Gm1 \times Gm2)/(2\pi C \times Gm)$. In practical integrated circuits the cutoff frequency can be as small as 50–100 KHz for a capacitance value C=10 pF.

The relationship between $V_{in}$ and $V_{out}$ is given by

Figure 4:
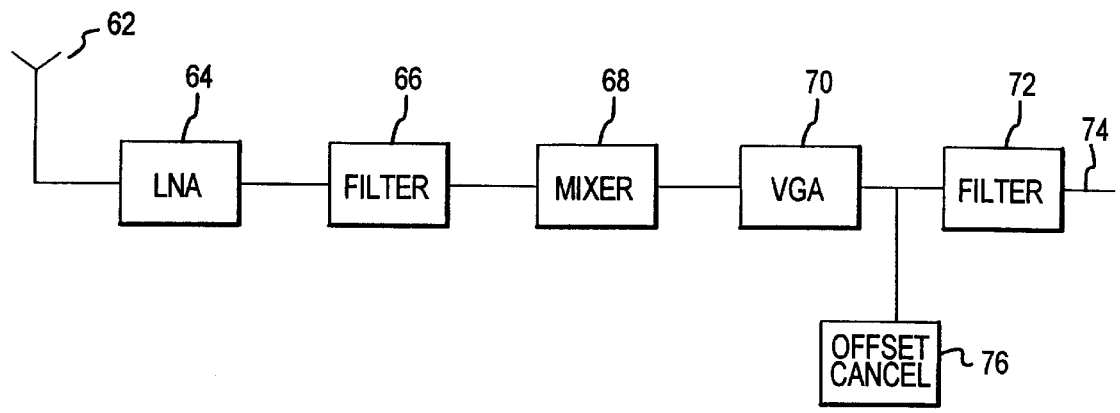
FIG. 4 illustrates schematically the application of the invention to an analog receiver chain

FIG. 4 illustrates schematically the application of the offset cancellation technique to an analog receiver chain 60. Generally these chains contain several amplifying blocks that allow the detection of small input analog signals received at an antenna 62. The signal detected by antenna 62 is first amplified by a low noise amplifier 64. The output of the low noise amplifier is filtered by a filter 66 and the output of the filter is conveyed to a mixer 68. The output of the mixer is amplified by a variable gain amplifier 70 which may contain several amplifying blocks. The amplified signal is then filtered by a filter 72 before appearing on output 74. In accordance with the invention, the performance of such an analog transceiver chain is improved by applying the offset cancellation technique as illustrated in FIG. 3 to the output of variable gain amplifier 70. If the variable gain amplifier contains several amplifying blocks, the offset cancellation circuit 76 is applied to the output of each of these amplifying blocks. As a result of including one or more offset cancellation circuits in the analog transceiver chain, depending on the number of amplifying blocks in the variable gain amplifier, the output detected at 74 contains a greatly reduced offset voltage component.

Figure 5:
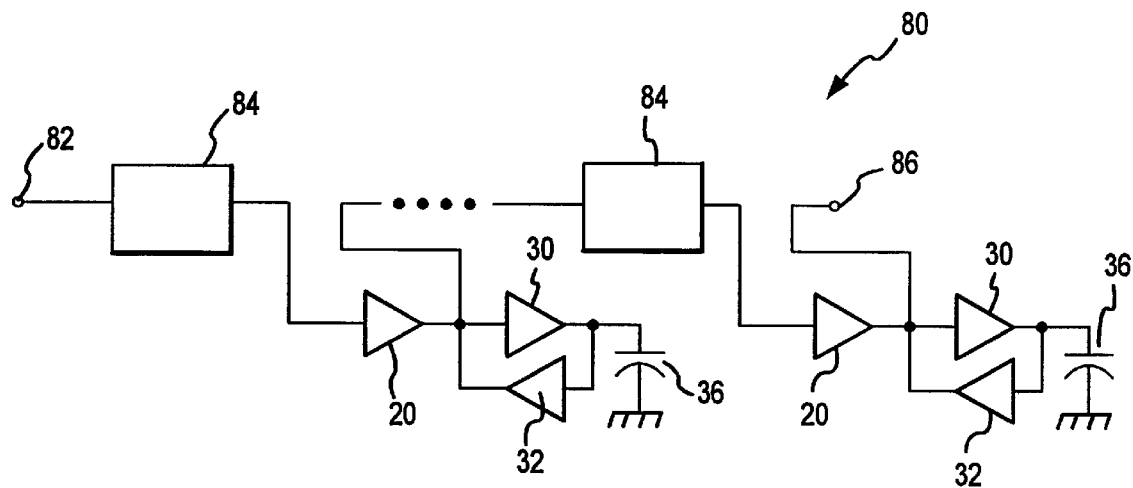
FIG. 5 illustrates a low offset amplifier in accordance with the invention.

FIG. 5 illustrates a low offset amplifier 80 in accordance with the invention. Amplifier 80 includes one or more amplifying blocks 84. Input 82 to the amplifier is coupled to the first of the amplifying blocks 84. The output of each amplifying block is coupled to an offset cancellation circuit similar to that illustrated in FIG. 3. The output of amplifying block 84 is coupled to the input of a transconductance stage 20. The output of transconductance stage 20 is coupled to the input of a second transconductance stage 30. The output of transconductance stage 30 is coupled to a grounded capacitor 36 and to the input of a third transconductance stage 32. The output of transconductance stage 32 is coupled to the input of the second transconductance stage 30. The output from the offset cancellation circuit is taken at the output of transconductance stage 20. This output is either used as the input to the next amplifying block 84 or is used as the output 86 of the low offset amplifier. The effect of applying the offset cancellation circuit at the output of each amplifying block is to reduce the offset voltage before that offset voltage can be amplified by the next amplification stage. By utilizing offset cancellation circuits in accordance with the invention, it is possible to reduce the offset in an analog chain by a factor of 100 or more. The residual offset detected at the output of the analog chain will be the one introduced by the circuit elements performing the offset cancellation. This can be as small as about 2 mV.

The circuit elements used to implement the offset cancellation circuit and the low offset amplifier, in accordance with the invention, can be implemented using any standard integrated circuit fabrication techniques. Gm-C filter blocks are particularly suited for such an application. The devices can be fabricated, for example, using standard MOS or CMOS design and fabrication techniques.

Thus, it is apparent that there has been provided, in accordance with the invention, a technique for offset voltage cancellation, a fully-integrated, continuous time, analog offset cancellation circuit, and a low offset amplifier which fully meet the needs set forth above. Although the technique and the circuits have been described and illustrated with reference to specific embodiments thereof, it is not intended that the invention be limited to those illustrative embodiments.

What is claimed is:

1. An analog offset-cancellation method comprising the steps of:

providing an input voltage wherein the input voltage includes an offset voltage;

converting the input voltage to an input current;

applying the input current to an inductance-equivalent circuit including applying the input voltage to the input of a first transconductance stage and obtaining an input current at the output of the first transconductance stage equal to the product of the input voltage and the transconductance of the first transconductance stage; and detecting the voltage derived across the inductance-equivalent circuit.

2. The method of claim 1 wherein the step of applying comprises the steps of:

providing second and third cross coupled transconductance stages having an input and an output;

coupling a capacitor from the output of the cross coupled trasconductance stages to a logical circuit ground; and coupling the input current to the input of the cross coupled transconductance stages.

3. An analog offset cancellation circuit comprising:

a voltage to-current converter having an input and an output;

an inductance-equivalent circuit, including applying the input voltage to the input of a first transconductance stage and obtaining an input current at the output of the first transconductance stage equal to the product of the input voltage and the transconductance of the first transconductance stage, coupled to the output such that the analog offset voltage is substantially cancelled;

an input terminal of the cancellation circuit coupled to the input; and an output terminal of the cancellation circuit coupled to the output.

4. The offset cancellation circuit of claim 3 wherein the inductance-equivalent circuit comprises:

second and third cross coupled transconductance stages, the cross coupled stages having a second input and a second output, the second input coupled to the output of the first transconductance stage; and a capacitor coupled from the second output to a voltage reference potential.

5. The offset cancellation circuit of claim 3 wherein the voltage to current converter comprises a first transconductance stage.

6. An analog offset cancellation circuit comprising:

a first transconductance stage having an input and an output;

second and third cross coupled transconductance stages, the cross coupled stages having a second input and a second output, the second input coupled to the output of the first transconductance stage;

a capacitor coupled from the second output to a logical circuit ground;

an input terminal at the input of the first transconductance stage; and an output terminal at the output of the first transconductance stage.

7. The analog offset cancellation circuit of claim 6 wherein the first transconductance stage has a transconductance of Gm, the second transconductance stage has a transconductance of Gm1, the third transconductance stage has a transconductance of Gm2, and the capacitor has a capacitance of C.

8. The analog offset cancellation circuit of claim 7 wherein the the circuit has a cutoff frequency, fc, equal to (Gm1+Gm2)/(2πCGm).

9. A low DC offset amplifier comprising:

a plurality of serially coupled amplifier blocks, each of the amplifier blocks having an input and an output;

a plurality of offset cancellation circuits, one coupled to the output of each of the amplifier blocks, each of the offset cancellation circuits comprising:

a first transconductance stage having an offset input terminal and a low offset output terminal, the offset input terminal coupled to the output of one of the plurality of serially coupled amplifier blocks;

a second transconductance stage having a second input terminal and a second output terminal, the second input terminal coupled to the low offset output terminal;

a third transconductance stage having a third input terminal and a third output terminal, the third input terminal coupled to the second output terminal and the third output terminal coupled to the second input terminal;

a capacitor coupled between the output of the third input terminal and a reference potential; and an output terminal of the offset cancellation circuit coupled to the low offset output terminal, the output terminal of each of the offset cancellation circuits except the last coupled to the input of one of the amplifier blocks, the output terminal of the last of the offset cancellation circuits providing an output terminal of the low dc offset amplifier.

10. A low offset amplifier comprising:

an amplifier block having an amplifier input terminal and an output terminal;

a first transconductance stage having a first input terminal and a first output terminal, the first input terminal coupled to the output terminal of the amplifier block;

a second transconductance stage having a second input terminal and a second output terminal, the second input terminal coupled to the first output terminal;

a third transconductance stage having a third input terminal and a third output terminal, the third input terminal coupled to the second output terminal and the third output terminal coupled to the second input terminal;

a capacitor coupled between the output of the third input terminal and a reference potential; and an amplifier output terminal coupled to the first output terminal.

* * * * *